US011088695B2

(12) United States Patent
Bae

(10) Patent No.: US 11,088,695 B2
(45) Date of Patent: Aug. 10, 2021

(54) PHASE-LOCKED LOOP APPARATUS AND METHOD FOR CLOCK SYNCHRONIZATION

(71) Applicant: Telefonaktiebolaget LM Ericsson (publ), Stockholm (SE)

(72) Inventor: Junkye Bae, Seoul (KR)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 0 days.

(21) Appl. No.: 16/977,352

(22) PCT Filed: Mar. 6, 2018

(86) PCT No.: PCT/KR2018/002664
§ 371 (c)(1),
(2) Date: Sep. 1, 2020

(87) PCT Pub. No.: WO2019/172467
PCT Pub. Date: Sep. 12, 2019

(65) Prior Publication Data
US 2021/0111725 A1    Apr. 15, 2021

(51) Int. Cl.
*H03L 7/087* (2006.01)
*H03L 7/089* (2006.01)
*H03L 7/099* (2006.01)

(52) U.S. Cl.
CPC .............. *H03L 7/087* (2013.01); *H03L 7/089* (2013.01); *H03L 7/099* (2013.01)

(58) Field of Classification Search
CPC ......... H03L 7/087; H03L 7/099; H03L 7/089; H03L 7/0893; H03L 7/095; H03L 7/08
See application file for complete search history.

(56) References Cited

U.S. PATENT DOCUMENTS 8,537,952 B1 *  9/2013  Arora ................. H03C 3/0925
                                                       375/376
10,187,074 B2    1/2019  Shimada
                    (Continued)

FOREIGN PATENT DOCUMENTS

JP      2017118371 A    6/2017
KR  1020090050636 A    5/2009
WO    2016144486 A1    9/2016

OTHER PUBLICATIONS

International Search Report dated Dec. 6, 2018 for International Application No. PCT/KR2018/002664 filed on Mar. 6, 2018, consisting of 11-pages.

*Primary Examiner* — Jung Kim
(74) *Attorney, Agent, or Firm* — Christopher & Weisberg, P.A.

(57) ABSTRACT

A phase-locked loop (PLL) apparatus and a method for clock synchronization are disclosed. According to an embodiment, the PLL apparatus includes an adjustable oscillator, one or more first difference determiners, one or more first parameter determiners and a loop integrator. The adjustable oscillator can generate an oscillating signal based on a control signal. Each first difference determiner can receive a first clock reference signal and determine a phase difference between the received first clock reference signal and the oscillating signal. Each first parameter determiner can receive a phase difference from the one or more first difference determiners and generate a first control parameter based on a variation of the phase difference. The loop integrator can integrate the one or more first control parameters to generate the control signal for the adjustable oscillator.

20 Claims, 6 Drawing Sheets

(56) References Cited

U.S. PATENT DOCUMENTS

2016/0373121 A1 12/2016 Lee et al.
2017/0257103 A1 9/2017 Nishida

* cited by examiner

[Fig. 1]
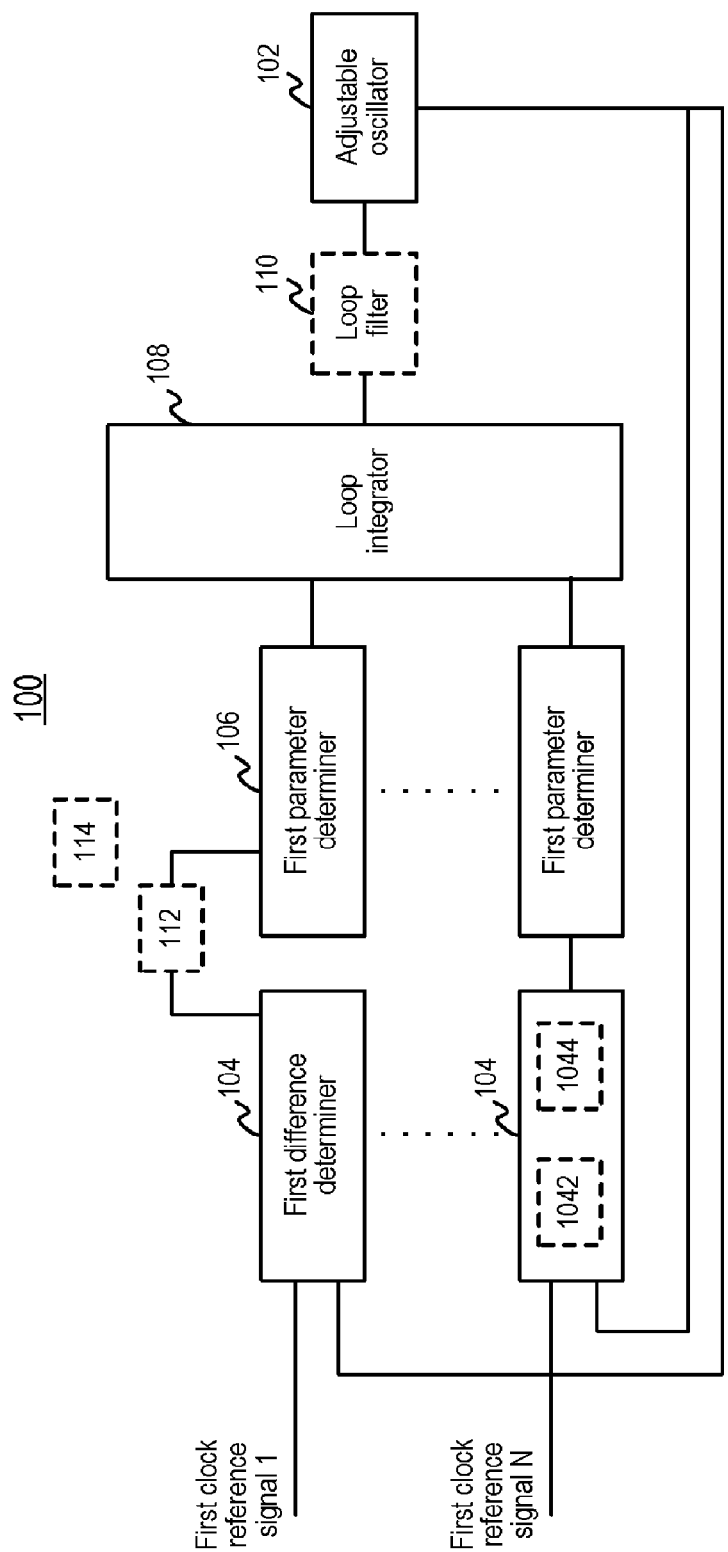

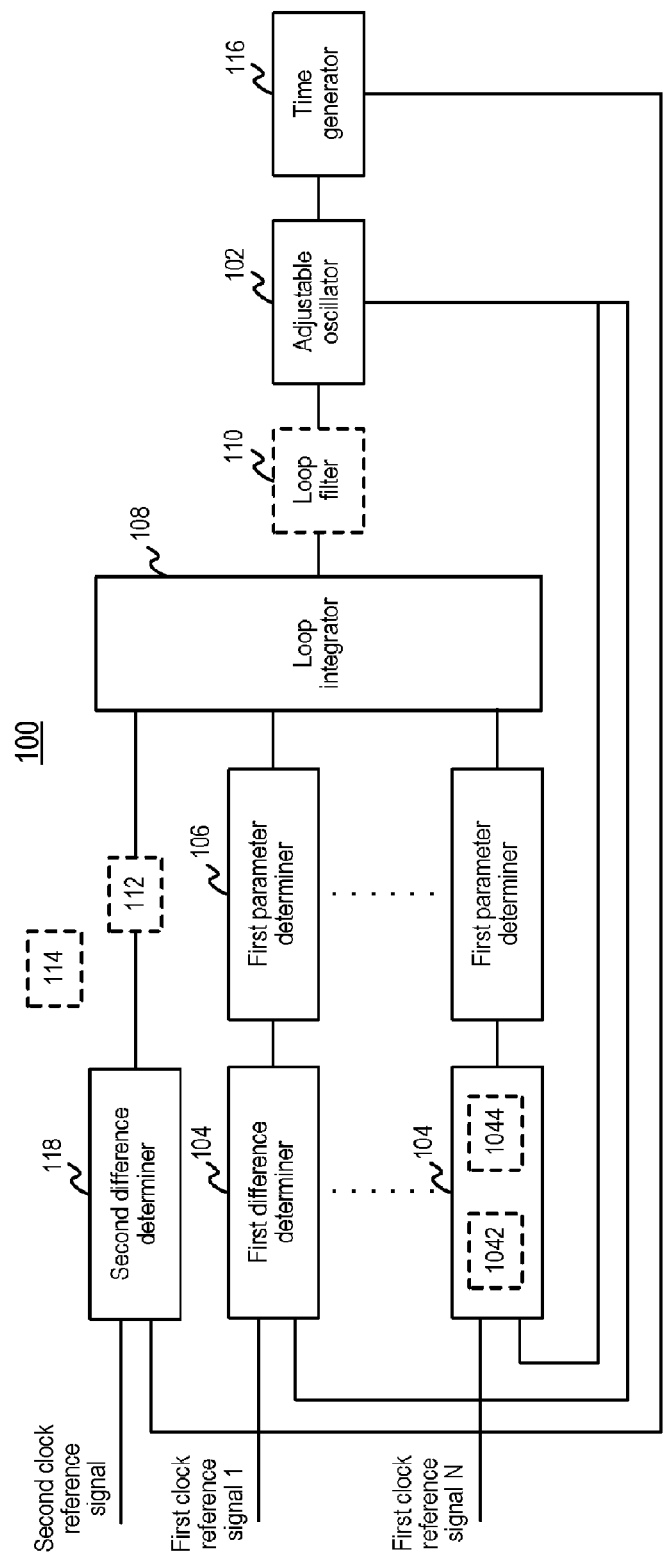
[Fig. 2]

[Fig. 3]
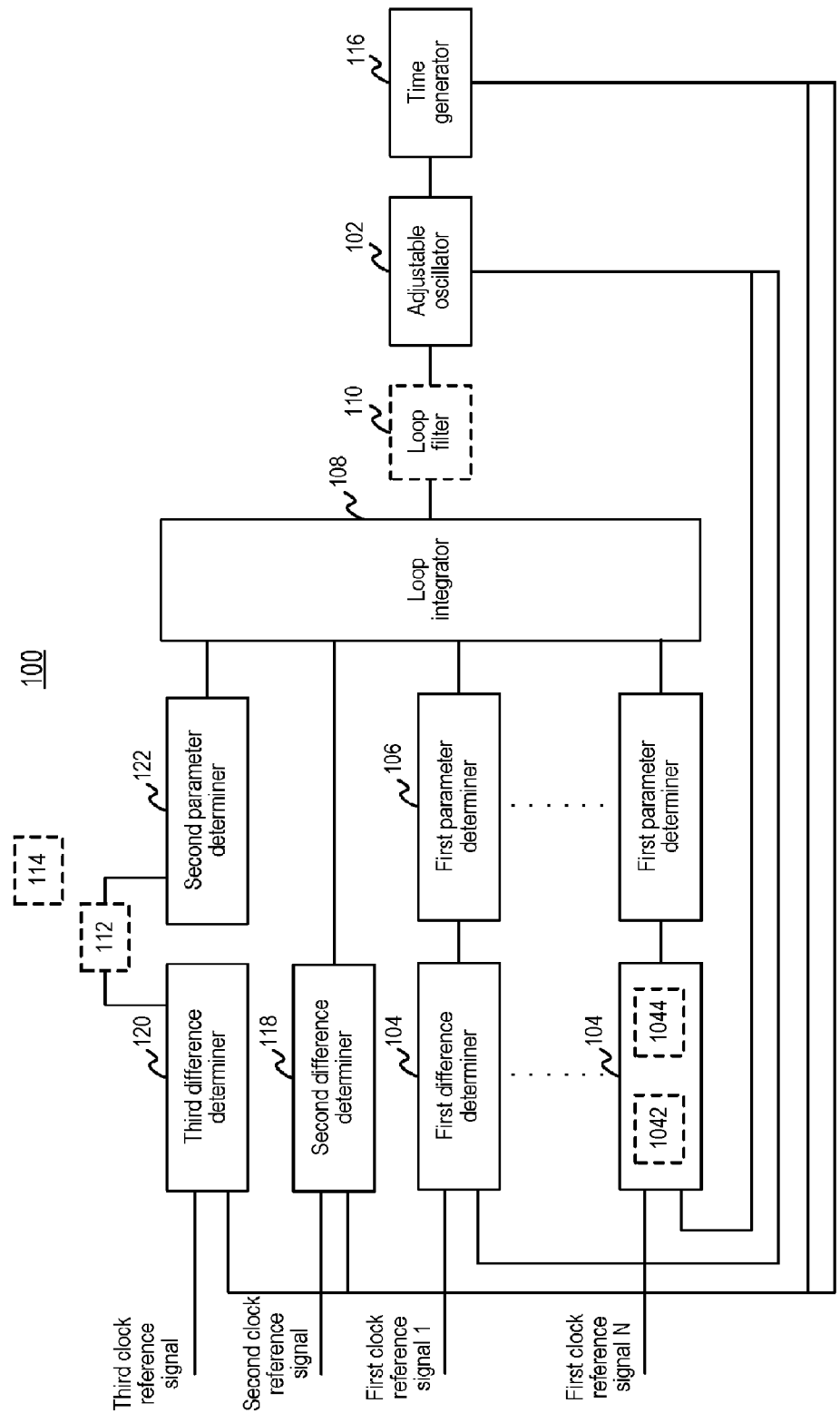

[Fig. 4]
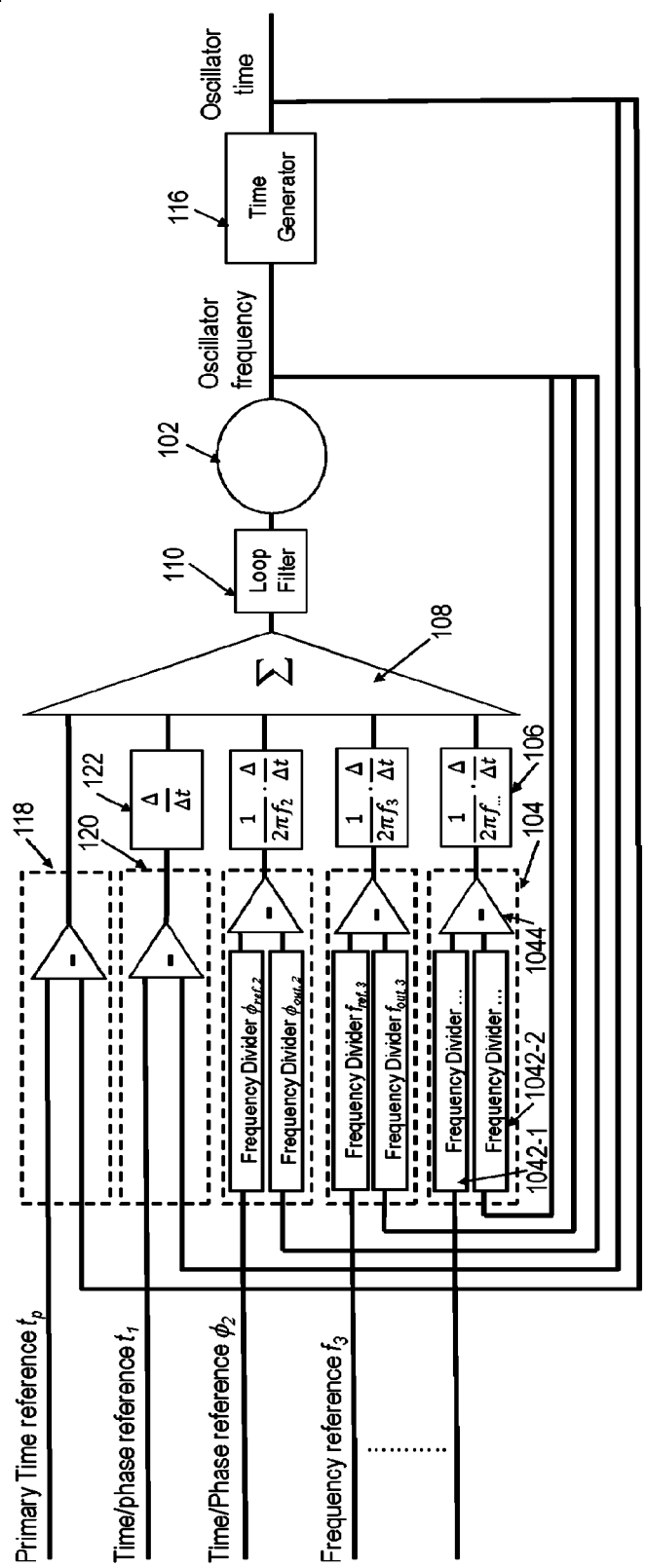

[Fig. 5]
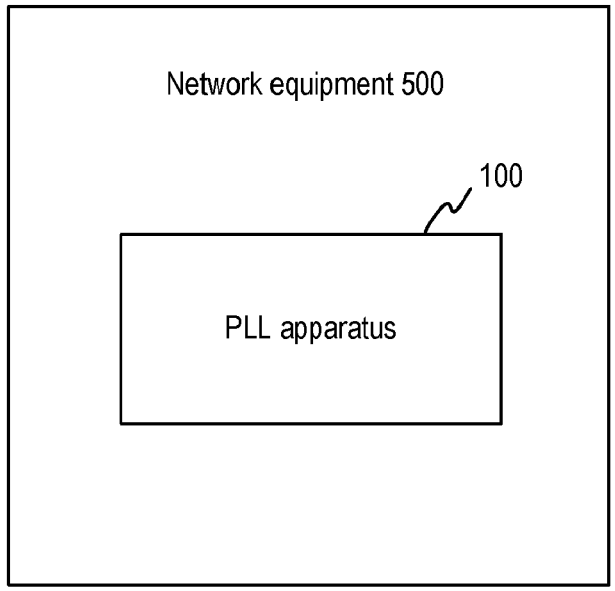
[Fig. 6]
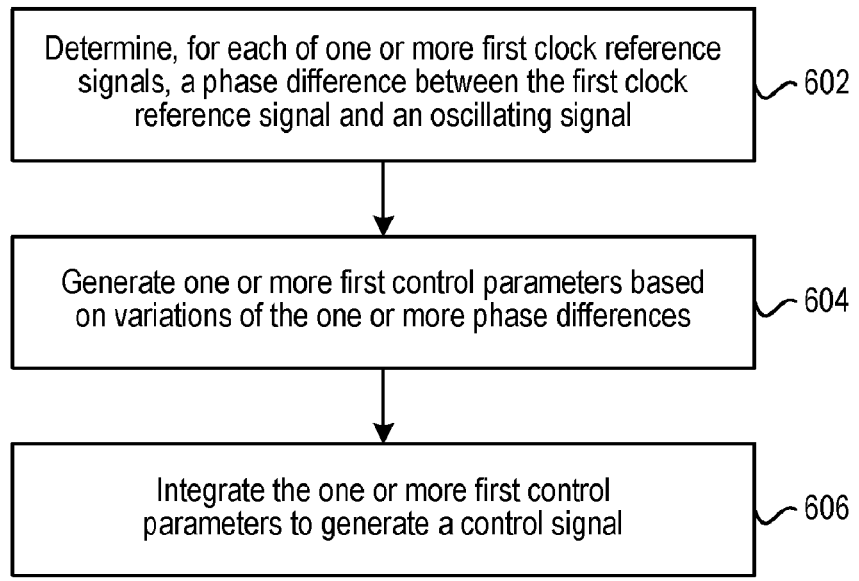

[Fig. 7]
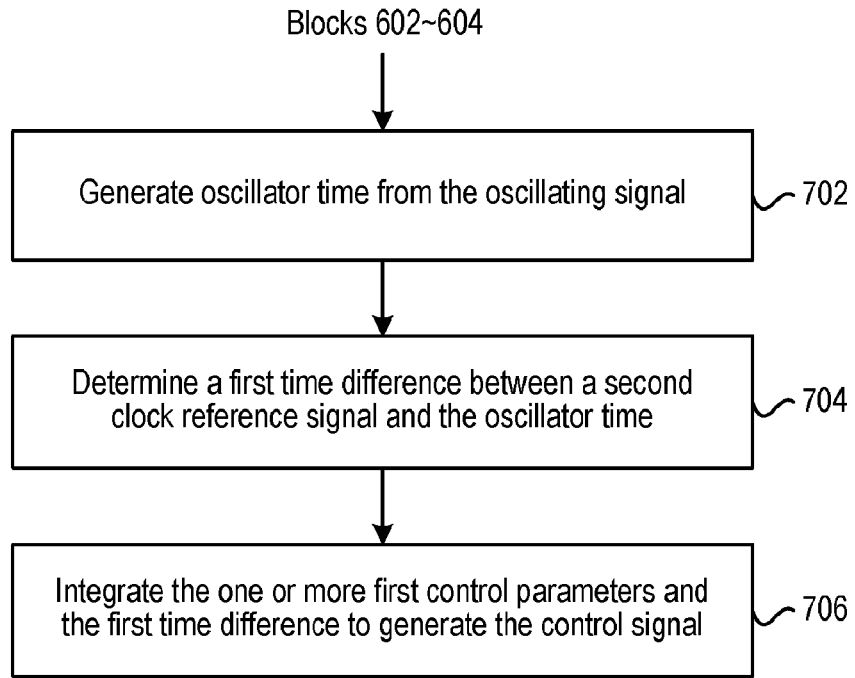
[Fig. 8]
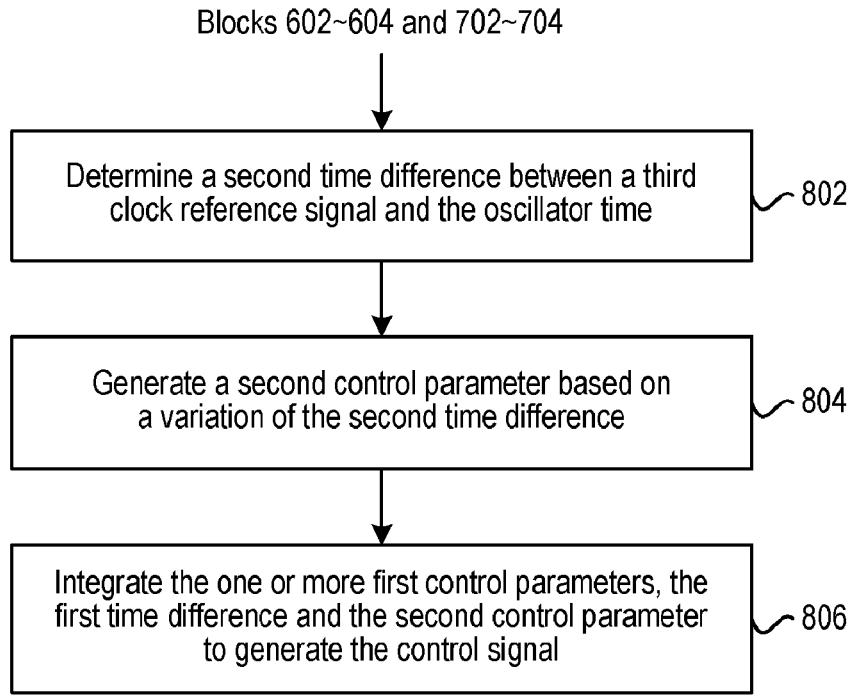

PHASE-LOCKED LOOP APPARATUS AND METHOD FOR CLOCK SYNCHRONIZATION

CROSS-REFERENCE TO RELATED APPLICATIONS

This application is a Submission Under 35 U.S.C. § 371 for U.S. National Stage Patent Application of International Application Number: PCT/KR2018/002664, filed Mar. 6, 2018 entitled "PHASE-LOCKED LOOP APPARATUS AND METHOD FOR CLOCK SYNCHRONIZATION," the entirety of which is incorporated herein by reference.

TECHNICAL FIELD

Embodiments of the disclosure generally relate to the field of electronic components, and, more particularly, to a phase-locked loop (PLL) apparatus and a method for clock synchronization as well as a network equipment comprising the PLL apparatus.

BACKGROUND ART

This section introduces aspects that may facilitate better understanding of the present disclosure. Accordingly, the statements of this section are to be read in this light and are not to be understood as admissions about what is in the prior art or what is not in the prior art.

A PLL is generally used in a clock recovery circuit to produce, from an incoming digital data signal (for example, in a digital transmission system), a clock signal which is used for timing purpose in processing the digital data signal. In common PLL circuits, a voltage-controlled crystal oscillator (VCXO), in which an oscillation frequency is controlled on the basis of a control voltage, generates an oscillating signal and the oscillating signal is divided by a divider. Thereafter, a phase comparator detects a phase difference between a reference signal and the divided output of the VCXO and outputsa digital signal in accordance with the phase difference. The outputsignal of the phase comparator may be smoothed by a loop filter. Then, it is used to control the VCXO based on a phase error between the reference signal and the output of the VCXO at the phase comparator. Thus, the PLL circuit is controlled so that the oscillation frequency of the VCXO substantiallymatches the frequency of the reference signal.

DISCLOSURE OF INVENTION

Technical Problem

This summary is provided to introduce a selection of concepts in a simplified form that are further described below in the detailed description. This summary is not intended to identify key features or essential features of the claimed subject matter, nor is it intended to be used to limit the scope of the claimed subject matter.

Solution to Problem

One of the objects of the disclosure is to provide an improved PLL solution.

According to one aspect of the disclosure, there is provided a PLL apparatus. The PLL apparatus comprises an adjustable oscillator configured to generate an oscillating signal based on a control signal. The PLL apparatus further comprises one or more first difference determiners each of which is configured to receive a first clock reference signal from one or more first clock reference sources, and to determine a phase difference between the received first clock reference signal and the oscillating signal from the adjustable oscillator. The PLL apparatus further comprises one or more first parameter determiners each of which is configured to receive a phase difference from the one or more first difference determiners, and to generate a first control parameter based on a variation of the phase difference. The PLL apparatus further comprises a loop integrator configured to integrate the one or more first control parameters from the one or more first parameter determiners to generate the control signal for the adjustable oscillator.

In an embodiment of the disclosure, the PLL apparatus further comprises a time generator configured to receive the oscillating signal from the adjustable oscillator and generate oscillator time from the oscillating signal. The PLL apparatus further comprises a second difference determiner configured to receive a second clock reference signal from a second clock reference source, and to determine a first time difference between the second clock reference signal and the oscillator time from the time generator. The loop integrator is configured to integrate the one or more first control parameters and the first time difference to generate the control signal for the adjustable oscillator.

In an embodiment of the disclosure, the PLL apparatus further comprises a third difference determiner configured to receive a third clock reference signal from a third clock reference source, and to determine a second time difference between the third clock reference signal and the oscillator time from the time generator. The PLL apparatus further comprises a second parameter determiner configured to receive the second time difference from the third difference determiner, and to generate a second control parameter based on a variation of the second time difference. The loop integrator is configured to integrate the one or more first control parameters, the first time difference and the second control parameter to generate the control signal for the adjustable oscillator.

In an embodiment of the disclosure, the first control parameter is generated by normalizing the variation of the phase difference with a unit time period.

In an embodiment of the disclosure, the first control parameter is generated by normalizing the variation of the phase difference based on the frequency of the corresponding first clock reference signal.

In an embodiment of the disclosure, the second control parameter is generated by normalizing the variation of the second time difference with a unit time period.

In an embodiment of the disclosure, the first or second parameter determiner is a differentiator.

In an embodiment of the disclosure, a number of the one or more first clock reference signals is more than one, and the more than one first clock reference signals have different types or different frequencies.

In an embodiment of the disclosure, at least one of the one or more first clock reference signals is a frequency reference signal or a phase reference signal.

In an embodiment of the disclosure, the frequency reference signal is or is derived from one of: a T1/E1 signal; a precise time protocol (PTP) signal; a network time protocol (NTP) signal; an x digital subscriber line (xDSL) signal; an x passive optical network (xPON) signal; a synchronous ethernet (SyncE) frequency signal; a synchronous digital hierarchy/synchronous optical network (SDH/SONET) signal; an NAVDATA signal from a global positioning system (GPS) receiver; and a carrier frequency signal from a GPS receiver.

In an embodiment of the disclosure, the phase reference signal is or is derived from one of: a PTP signal; an NTP signal; a generalized precision time protocol (gPTP) signal; and a phase reference signal from a GPS receiver.

In an embodiment of the disclosure, each of the second and third clock reference signals is a time reference signal which is or is derived from one of: a PTP signal; an NTP signal; a gPTP signal; and a time reference signal from a GPS receiver.

In an embodiment of the disclosure, the first difference determiner comprises a frequency divider configured to divide the frequency of the oscillating signal down to a target frequency corresponding to the received first clock reference signal. The first difference determiner further comprises a phase detector configured to compare the phase of the first clock reference signal and the phase of the divided oscillating signal to generate the phase difference.

In an embodiment of the disclosure, the PLL apparatus further comprises a loop filter that is connected between the loop integrator and the adjustable oscillator and is configured to smooth the control signal from the loop integrator.

In an embodiment of the disclosure, the PLL apparatus further comprises a plurality of gain modules each of which is connected between the first or second difference determiner and the loop integrator, and is configured to apply a weighting factor to the received phase or time difference. The PLL apparatus further comprises a controller configured to determine the weighting factors applied by the plurality of gain modules.

In an embodiment of the disclosure, the controller is configured to perform at least one of: decreasing the weighting factor corresponding to a frequency reference signal over time; and increasing the weighting factor corresponding to the second clock reference signal exponentially with the first time difference.

According to another aspect of the disclosure, there is provided a network equipment comprising a PLL apparatus according to the above aspect.

According to another aspect of the disclosure, there is provided a method for clock synchronization. The method comprises determining, for each of one or more first clock reference signals, a phase difference between the first clock reference signal and an oscillating signal generated by an adjustable oscillator. The method further comprises generating one or more first control parameters based on variations of the one or more phase differences. The method further comprises integrating the one or more first control parameters to generate a control signal. The adjustable oscillator is configured to generate the oscillating signal based on the control signal.

In an embodiment of the disclosure, the method further comprises generating oscillator time from the oscillating signal. The method further comprises determining a first time difference between a second clock reference signal and the oscillator time. The one or more first control parameters and the first time difference are integrated to generate the control signal.

In an embodiment of the disclosure, the method further comprises determining a second time difference between a third clock reference signal and the oscillator time. The method further comprises generating a second control parameter based on a variation of the second time difference. The one or more first control parameters, the first time difference and the second control parameter are integrated to generate the control signal.

In an embodiment of the disclosure, the first control parameter is generated by normalizing the variation of the phase difference with a unit time period.

In an embodiment of the disclosure, the first control parameter is generated by normalizing the variation of the phase difference based on the frequency of the corresponding first clock reference signal.

In an embodiment of the disclosure, the second control parameter is generated by normalizing the variation of the second time difference with a unit time period.

In an embodiment of the disclosure, the first or second control parameter is generated by a differentiator.

Advantageous Effects of Invention

According to one aspect of the disclosure, it is available to provide an improved PLL solution.

BRIEF DESCRIPTION OF DRAWINGS

These and other objects, features and advantages of the disclosure will become apparent from the following detailed description of illustrative embodiments thereof, which are to be read in connection with the accompanying drawings.

FIG. 1 is a diagram showing a PLL apparatus according to the first embodiment of the disclosure.

FIG. 2 is a diagram showing a PLL apparatus according to the second embodiment of the disclosure.

FIG. 3 is a diagram showing a PLL apparatus according to the third embodiment of the disclosure.

FIG. 4 is a diagram showing a PLL apparatus according to the fourth embodiment of the disclosure.

FIG. 5 is a diagram showing a network equipment according to an embodiment of the disclosure.

FIG. 6 is a flowchart illustrating a method for clock synchronization according to an embodiment of the disclosure.

FIG. 7 is a flowchart illustrating a method for clock synchronization according to another embodiment of the disclosure.

FIG. 8 is a flowchart illustrating a method for clock synchronization according to another embodiment of the disclosure.

MODE FOR THE INVENTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

The conventional PLL has a "single" clock reference. When in "locked" condition, the input clock reference signal and output signal are equal in phase and frequency. If the clock reference has an unstable or inaccurate frequency, the accuracy and stabilities of the oscillator will also be degraded following the clock reference. Thus, it has strong dependency on the "single" clock reference in the aspects of accuracy, stabilities and robustness.

Some existing systems use multiple timing reference signals from GPS and combine the timing errors to produce a more accurate input to the oscillator, where the oscillator output is fed back through the PLL circuit. Each of the timing errors is weighted, depending on how much the system would like each timing error to influence the oscillator input.

However, these systems only target time synchronization and require a direct line of sight with multiple satellites, lengthy processing time to search and acquire GPS signals, read the ephemeris data for a multiplicity of satellites and compute the time information. Furthermore, as the timing error exceeds a certain limit, the corresponding reference is excluded. However, even for highly accurate references, the phase can drift with time if they are not synchronized references. Thus, the systems require extremely high frequency accuracy.

The present disclosure proposes an improved PLL solution. Hereinafter, the solution will be described in detail with reference to FIGS. 1-8.

FIG. 1 is a block diagram showing a PLL apparatus according to the first embodiment of the disclosure. As shown, the PLL apparatus 100 comprises an adjustable oscillator 102, one or more first difference determiners 104, one or more first parameter determiners 106 and a loop integrator 108. The adjustable oscillator 102 is configured to generate an oscillating signal based on a control signal. The control signal may be generated by the loop integrator 108, which will be described in detail later. As an example, the adjustable oscillator 102 may be a voltage-controlled crystal oscillator (VCXO) which generates the oscillating signal based on the voltage of the control signal. As another example, the adjustable oscillator 102 may be an oven controlled crystal oscillator (OCXO), a temperature controlled crystal oscillator (TCXO), or any other similar device.

Each of the one or more first difference determiners 104 is configured to receive a first clock reference signal from one or more first clock reference sources, and to determine a phase difference between the received first clock reference signal and the oscillating signal from the adjustable oscillator. As an example, the first clock reference signal may be a frequency reference signal. The frequency reference signal refers to a signal which has frequency information and is used for frequency synchronization. The frequency synchronization refers to that two clocks are aligned in terms of their repeating interval (the "frequency"), but not in terms of phase or time. For example, the frequency reference signal may be derived from one of: a T1/E1 signal, a precise time protocol (PTP) signal based on institute of electrical and electronics engineers (IEEE) 1588, a network time protocol (NTP) signal, an x digital subscriber line (xDSL) signal, an x passive optical network (xPON) signal, a synchronous ethernet (SyncE) signal, a synchronous digital hierarchy/synchronous optical network (SDH/SONET) signal, or the like. Various frequency synchronization techniques may be used to derive the frequency reference signals from the signals listed above. In this case, the device (based on hardware and/or software) for performing the derivation may be or may not be a constituent part of the PLL apparatus 100. It is also possible that the frequency reference signals are the above-listed signals themselves. In this case, the device for performing the derivation is a constituent part of the PLL apparatus 100.

As another example, the first clock reference signal may be a phase reference signal. The phase reference signal refers to a signal which has frequency and phase information and is used for phase synchronization. The phase synchronization refers to that two clocks are aligned in terms of their repeating interval (the "frequency"), and also "phase" (a one-second interval), but without a common time origin (or "epoch"). For example, the phase reference signal may be derived from one of: a PTP signal based on IEEE 1588, an NTP signal, a generalized precision time protocol (gPTP) signal based on IEEE 802.1as, or the like. Various phase synchronization techniques may be used to derive the phase reference signals from the signals listed above. In this case, the device (based on hardware and/or software) for performing the derivation may be or may not be a constituent part of the PLL apparatus 100. It is also possible that the phase reference signals are the above-listed signals themselves. In this case, the device for performing the derivation is a constituent part of the PLL apparatus 100.

To determine the phase difference, the first difference determiner 104 may comprise a frequency divider 1042 and a phase detector 1044. The frequency divider 1042 may be configured to divide the frequency of the oscillating signal down to a target frequency corresponding to the received first clock reference signal. The oscillating signal is generated and fed back from the adjustable oscillator 102. The phase detector 1044 may be configured to compare the phase of the first clock reference signal and the phase of the divided oscillating signal to generate the phase difference. For example, if the first clock reference signal is a frequency reference signal, the phase detector may detect the difference of the periods between the two signals and convert the period difference to the phase difference.

Suppose the number of the one or more first clock reference signals is more than one. Then, as a first option, the more than one first clock reference signals may be frequency reference signals having same or different frequencies with each other. As a second option, the more than one first clock reference signals may be phase reference signals. As a third option, some of the first clock reference signals may be frequency reference signal(s) and the rest of the first clock reference signals may be phase reference signal(s). For the above first to third options, the PLL apparatus can be used for frequency/phase synchronization. In this case, a relatively low cost analog circuit is enough for processing the frequency/phase reference signal.

Each of the one or more first parameter determiners 106 is configured to receive a phase difference from the one or more first difference determiners 104, and to generate a first control parameter based on a variation of the phase difference. For example, the first control parameter may be generated by normalizing the variation of the phase difference with a unit time period. Optionally, the first control parameter may be generated by normalizing the variation of the phase difference based on the frequency of the corresponding first clock reference signal. As an exemplary example, the first parameter determiner may be implemented as a differentiator for generating the normalized phase difference variation.

Thus, phase difference variation based control is employed. That is, the phase difference for each clock reference may increase or decrease. Instead, the variation of the phase differences will be a constant value when the PLL is locked. This is unlike to the above existing systems in which the time difference between the GPS reference signal and the output clock signal is zero when the PLL is locked.

Due to the phase difference variation based control, phase drifts are used as control inputs for the adjustable oscillator. Even some clock references are not so accurate and can drift their phases, the oscillator can be controlled by a control signal which is generated from a plurality of variations of phase differences. Thus, relatively low frequency accuracy is required such that an accurate and stable clock source can be generated by means of multiple clock references which have relatively low accuracy.

Optionally, the clock accuracy can be enhanced by increasing the number of clock references. For example, an accurate clock can be generated by using hundreds of low accurate clock references. This can be especially useful in a network hub which has hundreds of connections or a radio base station which is connected with more than hundreds of subscribers.

The loop integrator 108 is configured to integrate the one or more first control parameters from the one or more first parameter determiners 106 to generate the control signal for the adjustable oscillator 102. For example, the first control parameters may be added together to obtain a sum, which may be multiplied by a constant to obtain a product. The product may be added to the previous integrated value to obtain the current integrated value, which may be output as the control signal. The control signal may be used to adjust the adjustable oscillator 102 as described above.

Optionally, the PLL apparatus 100 may further comprise a loop filter 110 that is connected between the loop integrator 108 and the adjustable oscillator 102 and is configured to smooth the control signal from the loop integrator 108.

Optionally, the PLL apparatus 100 may further comprise a plurality of gain modules 112 and a controller 114. Each of the gain modules 112 is connected between the first difference determiner 104 and the first parameter determiner 106, and is configured to apply a weighting factor to the received phase difference. The controller 114 is configured to determine the weighting factors applied by the plurality of gain modules 112.

As an example, the controller 114 may be configured to, when a phase difference is out of tolerance, decrease the weighting factor applied to the phase difference. In this way, when a problem exists in a clock reference source, the impact of the problematic clock reference source can be reduced. As another example, the controller 114 may be configured to, when all the phase differences are out of tolerance, apply a weighting factor having zero value to each of the phase differences. In this way, when all the clock reference sources are problematic, the oscillator frequency adjustments can be suspended.

FIG. 2 is a block diagram showing a PLL apparatus according to the second embodiment of the disclosure. As shown, in addition to the components of the first embodiment, the PLL apparatus 100 of the second embodiment further comprises a time generator 116 and a second difference determiner 118. The time generator 116 is configured to receive the oscillating signal from the adjustable oscillator 102 and generate oscillator time from the oscillating signal. The details of the time generator 116 may be well known to those skilled in the art and thus are omitted here.

The second difference determiner 118 is configured to receive a second clock reference signal from a second clock reference source, and to determine a first time difference between the second clock reference signal and the oscillator time from the time generator 116. The second clock reference signal is a time reference signal. The time reference signal refers to a signal which has frequency, phase and time information and is used for time synchronization. The time synchronization refers to that two clocks are aligned in terms of their repeating interval (the "frequency"), their "phase" (a one-second interval), and share a common time origin (or "epoch"). For example, the time reference signal may be derived from one of: a PTP signal based on IEEE 1588, an NTP signal, a gPTP signal based on IEEE 802.1as, or the like. Various time synchronization techniques may be used to derive the time reference signals from the signals listed above. In this case, the device (based on hardware and/or software) for performing the derivation may be or may not be a constituent part of the PLL apparatus 100. It is also possible that the time reference signals are the above-listed signals themselves. In this case, the device for performing the derivation is a constituent part of the PLL apparatus 100.

For example, the second difference determiner 118 may be a detector configured to compare the time information in the second clock reference signal and the oscillator time to generate the time difference. Optionally, the time difference may be expressed in terms of a corresponding phase difference.

Although only one second clock reference signal is shown in FIG. 2, there may be more than one second clock reference signals. Correspondingly, there may be more than one second difference determiners 118. Suppose the first clock reference signal(s) and the second clock reference signal(s) constitute a group. Then, as a fourth option, some of the group of clock reference signals may be time reference signal(s) and the rest of the group of clock reference signals may be frequency reference signal(s). As a fifth option, some of the group of clock reference signals may be time reference signal(s) and the rest of the group of clock reference signals may be phase reference signal(s). As a sixth option, some of the group of clock reference signals may be time reference signal(s), some of the group of clock reference signals may be frequency reference signal(s), and the rest of the group of clock reference signals may be phase reference signal(s). For the above fourth to sixth options, the PLL apparatus can be used for time synchronization. Specifically, the time synchronization can be achieved with the time information from the time reference signal(s).

For the above fourth to sixth options, the oscillator frequency can be rapidly stabilized with frequency/phase references. This is unlike to the time reference based clock in the above existing systems which has relatively less number of clock samples, has quantize errors, and requires longer time to search/acquire the time information. Furthermore, for the above fourth to sixth options, when every time references in the clock references are failed or unstable, the time can still keep working with the assistance of the connected frequency/phase references. Thus, the instability of the output clock can be minimized and the transition time caused by switching of the clock reference can be minimized.

In the above first to sixth options, since various types of clock reference sources other than GPS receiver are used, the lengthy processing time required by GPS receiver can be avoided. However, the present disclosure is not limited to the above examples. As another example, the frequency/phase/time reference signal may be provided from a GPS receiver. In this case, the frequency reference signal may be an NAVDATA signal or a carrier frequency signal.

In the second embodiment, the loop integrator 108 is configured to integrate the one or more first control parameters and the first time difference to generate the control signal for the adjustable oscillator 102. Due to this configuration, when the first time difference is small, it can work just like the first control parameter(s) generated from the phase difference(s). When the first time difference increases, the weighting for the second clock reference signal will increase and the first time difference will be the dominant parameter to the loop integrator. Thereby, the weighting for the second clock reference signal can be increased with the first time difference suchthat the first time difference can be limited subsequently.

Similar to the first embodiment, the PLL apparatus 100 of the second embodiment may optionally comprise a plurality of gain modules 112 and a controller 114. Each of the gain modules 112 is connected between the first difference determiner 104 (or the second difference determiner 118) and the first parameter determiner 106 (or the loop integrator 108), and is configured to apply a weighting factor to the received phase or time difference. The controller 114 is configured to determine the weighting factors applied by the plurality of gain modules 112.

As an example, the controller 114 may be configured to, decrease the weighting factor corresponding to a frequency reference signal over time. In this way, the time accuracy and stability can be increased in steady state. As another example, the controller 114 may be configured to, increase the weighting factor corresponding to the second clock reference signal exponentially with the first time difference.

FIG. 3 is a diagram showing a PLL apparatus according to the third embodiment of the disclosure. As shown, in addition to the components of the second embodiment, the PLL apparatus 100 of the third embodiment further comprises a third difference determiner 120 and a second parameter determiner 122. The third difference determiner 120 is configured to receive a third clock reference signal from a third clock reference source, and to determine a second time difference between the third clock reference signal and the oscillator time from the time generator 116. The third clock reference signal is a time reference signal which has been described above. For example, the third difference determiner 120 may be a detector configured to compare the time information in the third clock reference signal and the oscillator time to generate the time difference. Optionally, the time difference may be expressed in terms of a corresponding phase difference.

The second parameter determiner 122 is configured to receive the second time difference from the third difference determiner 120, and to generate a second control parameter based on a variation of the second time difference. For example, the second control parameter may be generated by normalizing the variation of the second time difference with a unit time period. As an exemplary example, the second parameter determiner may be implemented as a differentiator for generating the normalized time difference variation.

In the third embodiment, the loop integrator 108 is configured to integrate the one or more first control parameters, the first time difference and the second control parameter to generate the control signal for the adjustable oscillator 102. Although only one third clock reference signal is shown in FIG. 3, there may be more than one third clock reference signals. Correspondingly, there may be more than one third difference determiners 120 and more than one second parameter determiners 122.

FIG. 4 is a block diagram showing a PLL apparatus according to the fourth embodiment of the disclosure. This embodiment is similar to the third embodiment. Thus, only the differences therebetween will be described. As shown, the second clock reference signal is a primary time reference signal and the third clock reference signal is a secondary time reference signal ($t_1$). The "time/phase reference" mentioned in FIG. 4 means that a time reference signal may also be used for phase synchronization since the time reference signal has frequency and phase information. One of the first clock reference signals is a phase reference signal ($\Phi_2$) and the rest of the first clock reference signals are frequency reference signals having different frequencies with each other. The first difference determiner 104 includes a first frequency divider 1042-1, a second frequency divider 1042-2 and a phase detector 1044. The first frequency divider 1042-1 is configured to divide the frequency of the received first clock reference signal down to a target frequency. The second frequency divider 1042-2 is configured to divide the frequency of the oscillating signal down to the target frequency. The phase detector 1044 is configured to compare the phase of the divided first clock reference signal and the phase of the divided oscillating signal to generate the phase difference.

In this embodiment, the first parameter determiner 106 is a differentiator configured to calculate, for the i-th first clock reference, the first control parameter $p_{1i}$ as:

$$p_{1i} = \frac{1}{2\pi f_i} \cdot \frac{\Delta}{\Delta t},$$

where $f_i$ is the frequency of the i-th first clock reference and $\Delta$ is the variation of the phase differences during the time period $\Delta t$. Similarly, the second parameter determiner 122 is a differentiator configured to calculate, for the third clock reference, the second control parameter $p_2$ as:

$$p_2 = \frac{\Delta}{\Delta t},$$

where $\Delta$ is the variation of the time differences during the time period $\Delta t$.

According to the above configuration, when the first time difference (or time offset) is small, the primary time reference can work just like other time references (e.g., same as the time reference t1). However, when the time offset (or time error) between the selected time reference (e.g., the primary time reference) and the oscillator time increases, the weighting for the selected time reference will increase and the time error will be the dominant control parameter to the loop integrator. Thus, the weighting for the primary time reference can be increased with the time error to limit the time difference between the primary time reference and the generated time.

Note that the present disclosure is not limited to the above examples. In the fifth embodiment, the PLL apparatus 100 may comprise the adjustable oscillator 102, the time generator 116, the second difference determiner 118, the third difference determiner 120, the second parameter determiner 122 and a loop integrator 108. The loop integrator 108 is configured to integrate the first time difference and the second control parameter to generate the control signal for the adjustable oscillator 102. Note that there may be more than one second clock reference signals and more than one third clock reference signals. Correspondingly, there may be more than one second difference determiners 118, more than one third difference determiners 120 and more than one second parameter determiners 122.

FIG. 5 is a diagram showing a network equipment according to an embodiment of the disclosure. As shown, the network equipment 500 comprises the PLL apparatus 100 described above. The network equipment 500 may be, for example, a radio base station, a network hub, or any other network equipment which needs clock synchronization. The other configurations of the network equipment 500 may be well known to those skilled in the art and thus are omitted here.

FIG. 6 is a flowchart illustrating a method for clock synchronization according to an embodiment of the disclosure. At block 602, for each of one or more first clock reference signals, a phase difference is determined between the first clock reference signal and an oscillating signal generated by an adjustable oscillator. This may be implemented by the one or more first difference determiners 104 as described above. At block 604, one or more first control parameters are generated based on variations of the one or more phase differences. This may be implemented by the one or more first parameter determiners 106 as described above. At block 606, the one or more first control parameters are integrated to generate a control signal. This may be implemented by the loop integrator 108 as described above. The adjustable oscillator is configured to generate the oscillating signal based on the control signal. Optionally, the control signal may be smoothed prior to supplying the control signal to the adjustable oscillator.

FIG. 7 is a flowchart illustrating a method for clock synchronization according to another embodiment of the disclosure. As shown, the method comprises blocks 602-604 and 702-706. At block 702, oscillator time is generated from the oscillating signal. This may be implemented by the time generator 116 as described above. At block 704, a first time difference is determined between a second clock reference signal and the oscillator time. This may be implemented by the second difference determiner 118 as described above. At block 706, the one or more first control parameters and the first time difference are integrated to generate the control signal for the adjustable oscillator. This may be implemented by the loop integrator 108 as described above.

FIG. 8 is a flowchart illustrating a method for clock synchronization according to another embodiment of the disclosure. As shown, the method comprises blocks 602-604, 702-704 and 802-806. At block 802, a second time difference is determined between a third clock reference signal and the oscillator time. This may be implemented by the third difference determiner 120 as described above. At block 804, a second control parameter is generated based on a variation of the second time difference. This may be implemented by the second parameter determiner 122 as described above. At block 806, the one or more first control parameters, the first time difference and the second control parameter are integrated to generate the control signal. This may be implemented by the loop integrator 108 as described above. It should be noted that two blocks shown in succession may, in fact, be executed substantially concurrently, or the blocks may sometimes be executed in the reverse order, depending upon the functionalityinvolved.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the function of the program modules may be combined or distributed as desired in various embodiments. In addition, the function may be embodied in whole or in part in firmware or hardware equivalents such as integrated circuits, field programmable gate arrays (FPGA), and the like.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/ or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

The invention claimed is:

1. A phase-locked loop (PLL) apparatus comprising:
an adjustable oscillator configured to generate an oscillating signal based on a control signal;
one or more first difference determiners each of which is configured to receive a first clock reference signal from one or more first clock reference sources, and to determine a phase difference between the received first clock reference signal and the oscillating signal from the adjustable oscillator;
one or more first parameter determiners each of which is configured to receive a phase difference from the one or more first difference determiners, and to generate a first control parameter based on a variation of the phase difference;
a loop integrator configured to integrate the one or more first control parameters from the one or more first parameter determiners to generate the control signal for the adjustable oscillator;
a time generator configured to receive the oscillating signal from the adjustable oscillator and to generate oscillator time from the oscillating signal;
a second difference determiner configured to receive a second clock reference signal from a second clock reference source, and to determine a first time difference between the second clock reference signal and the oscillator time from the time generator; and
the loop integrator being configured to integrate the one or more first control parameters and the first time difference to generate the control signal for the adjustable oscillator.

2. The PLL apparatus according to claim 1, further comprising:
a third difference determiner configured to receive a third clock reference signal from a third clock reference source, and to determine a second time difference between the third clock reference signal and the oscillator time from the time generator; and
a second parameter determiner configured to receive the second time difference from the third difference determiner, and to generate a second control parameter based on a variation of the second time difference;
wherein the loop integrator is configured to integrate the one or more first control parameters, the first time difference and the second control parameter to generate the control signal for the adjustable oscillator.

3. The PLL apparatus according to claim 1, wherein the first control parameter is generated by normalizing the variation of the phase difference with a unit time period.

4. The PLL apparatus according to claim 1, wherein the first control parameter is generated by normalizing the variation of the phase difference based on the frequency of the corresponding first clock reference signal.

5. The PLL apparatus according to claim 2, wherein the second control parameter is generated by normalizing the variation of the second time difference with a unit time period.

6. The PLL apparatus according to claim 3, wherein one of the first and a second parameter determiner is a differentiator.

7. The PLL apparatus according to claim 1, wherein a number of the one or more first clock reference signals is more than one, and the more than one first clock reference signals have different types or different frequencies.

8. The PLL apparatus according to claim 1, wherein at least one of the one or more first clock reference signals is one of a frequency reference signal and a phase reference signal.

9. The PLL apparatus according to claim 8, wherein the frequency reference signal is or is derived from one of:
a T1/E1 signal;
a precise time protocol (PTP) signal;
a network time protocol (NTP) signal;
an x digital subscriber line (xDSL) signal;
an x passive optical network (xPON) signal;
a synchronous ethernet (SyncE) frequency signal;
a synchronous digital hierarchy/synchronous optical network (SDH/SONET) signal;
an NAVDATA signal from a global positioning system (GPS) receiver; and
a carrier frequency signal from a GPS receiver.

10. The PLL apparatus according to claim 8, wherein the phase reference signal is or is derived from one of:
a precise time protocol (PTP) signal;
a network time protocol (NTP) signal;
a generalized precision time protocol (gPTP) signal; and
a phase reference signal from a global positioning system (GPS) receiver.

11. The PLL apparatus according to claim 1, wherein each of the second and third clock reference signals is a time reference signal which is or is derived from one of:
a precise time protocol (PTP) signal;
a network time protocol (NTP) signal;
a generalized precision time protocol (gPTP) signal; and
a time reference signal from a global positioning system (GPS) receiver.

12. The PLL apparatus according to claim 1, wherein the first difference determiner comprises:
a frequency divider configured to divide the frequency of the oscillating signal down to a target frequency corresponding to the received first clock reference signal; and
a phase detector configured to compare the phase of the first clock reference signal and the phase of the divided oscillating signal to generate the phase difference.

13. The PLL apparatus according to claim 1, further comprising:
a loop filter connected between the loop integrator and the adjustable oscillator and is configured to smooth the control signal from the loop integrator.

14. A network equipment comprising:
a phase-locked loop (PLL) apparatus, the phase-locked loop (PLL) apparatus comprising:
an adjustable oscillator configured to generate an oscillating signal based on a control signal;
one or more first difference determiners each of which is configured to receive a first clock reference signal from one or more first clock reference sources, and to determine a phase difference between the received first clock reference signal and the oscillating signal from the adjustable oscillator;
one or more first parameter determiners each of which is configured to receive a phase difference from the one or more first difference determiners, and to generate a first control parameter based on a variation of the phase difference;

a loop integrator configured to integrate the one or more first control parameters from the one or more first parameter determiners to generate the control signal for the adjustable oscillator;

a time generator configured to receive the oscillating signal from the adjustable oscillator and to generate oscillator time from the oscillating signal;

a second difference determiner configured to receive a second clock reference signal from a second clock reference source, and to determine a first time difference between the second clock reference signal and the oscillator time from the time generator; and the loop integrator being configured to integrate the one or more first control parameters and the first time difference to generate the control signal for the adjustable oscillator.

15. A method for clock synchronization, the method comprising:

determining, for each of one or more first clock reference signals, a phase difference between the first clock reference signal and an oscillating signal generated by an adjustable oscillator;

generating one or more first control parameters based on variations of the one or more phase differences; and integrating the one or more first control parameters to generate a control signal, the adjustable oscillator being configured to generate the oscillating signal based on the control signal;

generating oscillator time from the oscillating signal;

determining a first time difference between a second clock reference signal and the oscillator time; and the one or more first control parameters and the first time difference are integrated to generate the control signal.

16. The method according to claim 15, further comprising:

determining a second time difference between a third clock reference signal and the oscillator time; and generating a second control parameter based on a variation of the second time difference;

wherein the one or more first control parameters, the first time difference and the second control parameter are integrated to generate the control signal.

17. The method according to claim 15, wherein the first control parameter is generated by normalizing the variation of the phase difference with a unit time period.

18. The method according to claim 15, wherein the first control parameter is generated by normalizing the variation of the phase difference based on the frequency of the corresponding first clock reference signal.

19. The method according to claim 16, wherein the second control parameter is generated by normalizing the variation of the second time difference with a unit time period.

20. The method according to claim 17, wherein one of the first and a second control parameter is generated by a differentiator.

* * * * *